United States Patent
Burke et al.

(10) Patent No.: US 6,537,910 B1
(45) Date of Patent: Mar. 25, 2003

(54) FORMING METAL SILICIDE RESISTANT TO SUBSEQUENT THERMAL PROCESSING

(75) Inventors: Robert Burke, Boise, ID (US); Farrell Good, Boise, ID (US); Anand Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 09/698,745

(22) Filed: Oct. 27, 2000

Related U.S. Application Data

(62) Division of application No. 09/145,784, filed on Sep. 2, 1998, now Pat. No. 6,210,813.

(51) Int. Cl.$^7$ .............................................. C23C 16/24
(52) U.S. Cl. ..................... 438/680; 438/682; 438/683; 427/255.15; 427/255.18; 427/255.27; 427/255.7
(58) Field of Search .................. 427/255.15, 255.18, 427/255.28, 255.7; 438/680, 682, 683

(56) References Cited

U.S. PATENT DOCUMENTS

| | | | |
|---|---|---|---|
| 4,492,971 A | | 1/1985 | Bean et al. |
| 4,554,045 A | | 11/1985 | Bean et al. |
| 4,684,542 A | | 8/1987 | Jasinski et al. |
| 4,707,197 A | | 11/1987 | Hensel et al. |
| 4,755,256 A | | 7/1988 | Ditchek |
| 5,015,592 A | | 5/1991 | Moldovan |
| 5,231,056 A | | 7/1993 | Sandhu |
| 5,240,739 A | | 8/1993 | Doan et al. |
| 5,278,100 A | | 1/1994 | Doan et al. |
| 5,344,792 A | | 9/1994 | Sandhu et al. |
| 5,376,405 A | | 12/1994 | Doan et al. |
| 5,504,704 A | * | 4/1996 | Sato et al. ................... 257/314 |
| 5,558,910 A | | 9/1996 | Telford et al. |
| 5,726,096 A | | 3/1998 | Jung |
| 5,792,708 A | | 8/1998 | Zhou et al. |

FOREIGN PATENT DOCUMENTS

| | | |
|---|---|---|
| EP | 0 256 337 A1 | 2/1988 |
| JP | 63-120419 A | 5/1988 |

OTHER PUBLICATIONS

Washidzu et al., "In situ stress measurement of CVD deposited tungsten silicides.", Appl. Phys. Lett. Apr. 1, 1991, pp. 1425–1427.

Akimoto et al., "Formatin of $W_xSi_{(1-x)}$ by plasma CVD", Appl. Phys. Lett. Sep. 1, 1991, pp. 445–447.

Shioya et al., "Analysis of stress in chemical vapor deposition tungsten silicide film", J. Appl. Phys. 58 (11), Dec. 1, 1985, pp. 4194–4199.

Hara et al., "Composition of CVD Tungsten Silicides", J. Electrochem. Soc.: Solid–State Science and Technology, vol. 134, May 1987, pp. 1302–1306.

Lee et al., Effects of $WF_6$ gas rate on properties of selective CVD–W by $SiH_4$ reduction, INSPEC Abstract No. A9219 8230–003.

Shioya et al., "High–temperature stress measurement on chemical–vapor–deposited tungsten silicide and tungsten films", J. Appl. Phys. 61 (2), Jan. 15, 1987, pp. 561–566.

J.G. Byrne, "Microstructure and properties of CVD tungsten and some tungsten alloys", Abstract, J. Vac. Sci. Technol., vol. 11, No. 4, Jul./Aug. 1974.

* cited by examiner

*Primary Examiner*—Timothy Meeks
(74) *Attorney, Agent, or Firm*—Knobbe, Martens, Olson & Bear, LLP

(57) ABSTRACT

A metal suicide film and method of forming the same are provided. The method comprises depositing metal silicide layers onto a substrate assembly with alternating layers of silicon. The resulting metal silicide film has a disrupted grain structure and smaller grain sizes than prior art films of the same thickness, which increases the resistance of the material to stress cracks in subsequent thermal processing and reduces the overall residual stress of the material.

53 Claims, 4 Drawing Sheets

FORMING METAL SILICIDE RESISTANT TO SUBSEQUENT THERMAL PROCESSING

This application is a divisional of U.S. patent application Ser. No. 09/145,784, filed Sep. 2, 1998 now U.S. Pat. No. 6,210,813.

BACKGROUND OF THE INVENTION

1. Field of the Invention

The present invention relates to forming a metal silicide film, and more particularly, to a method of depositing a metal silicide film that is robust to stress cracks in subsequent thermal processing.

2. Description of the Related Art

Refractory metal silicides are attractive materials for semiconductor fabrication because of their high melting points and low resistivities. In particular, these materials are popular for use in the formation of integrated circuits as intermediate barriers or conducting films, runners or wiring. Metal suicides are also used for a polycide gate structure composed of a polysilicon layer and a metal silicide layer used for the gate electrode.

Metal suicides are typically formed by a deposition process such as chemical vapor deposition (CVD) or sputtering. For example, a forming tungsten silicide by a conventional CVD process involves the reaction between silane ($SiH_4$) and tungsten hexafluoride ($WF_6$). In order to avoid gas phase nucleation of the metal silicide on the walls of the reaction chamber, the ratio of $SiH_4$ to $WF_6$ is kept high, on the order of about 50:1. Tungsten silicide formed by this reaction is non-stoichiometric $WSi_x$, with the "x" factor depending on the silane flows and generally having a value of between about 2 and 3.

One problem with the deposition of metal silicides is that the resulting film often has high stress. For example, a tungsten silicide film formed by the conventional CVD process described above will have high residual tensile stress. Because such films are deposited at elevated temperatures, upon subsequent cooling of the film, a tensile stress is created by the differences in thermal expansion coefficients between the deposited film and an underlying substrate. Furthermore, stresses also arise in the deposited material due to defects such as dislocations in the resulting crystal structure. Because of the residual stress of the material, underlying topography and thermal processing of the device after $WSi_x$ deposition makes $WSi_x$ interconnects susceptible to stress cracks and material failure. While it has been found that increasing silane flows can reduce this stress, increasing silane results in poor step coverage for the film.

Accordingly, what is needed is a metal silicide film for a semiconductor device having low internal stress. In particular, this metal silicide film should be robust to subsequent thermal processing to prevent the formation of stress cracks in the film that may lead to material failure.

SUMMARY OF THE INVENTION

Briefly stated, a metal silicide film and method of forming the same are provided. The method comprises depositing metal silicide layers onto a substrate assembly with alternating layers of silicon. The resulting metal silicide film has a disrupted grain structure and smaller grain sizes than prior art films of the same thickness, which increases the resistance of the material to stress cracks in subsequent thermal processing and reduces the overall residual stress of the material.

In one aspect of the present invention, a method is provided for forming an electrically conductive film. First, a metal silicide layer is formed over a substrate assembly. Second, a silicon layer is formed over the metal silicide layer. Third, a metal silicide layer is formed over the silicon layer. Fourth, the steps of forming a silicon layer and forming a metal silicide layer over the silicon layer are sequentially repeated until a film of desired thickness is formed. In one preferred embodiment, these steps are repeated twice to form a film having a thickness of about 600 Å with each metal silicide layer having a thickness of about 150 Å and each silicon layer having a thickness of about one or two monolayers.

In another aspect of the present invention, a method of forming a tungsten silicide film by chemical vapor deposition (CVD) is provided. This method generally comprises the following steps:

(a) introducing a silicon gas flow into a CVD chamber;
(b) introducing a tungsten gas flow into the chamber which reacts with the silicon gas flow to form a layer of tungsten silicide;
(c) shutting off the tungsten gas flow from the chamber while maintaining the silicon gas source into the chamber;
(d) reintroducing the tungsten gas flow into the chamber after the step of shutting off, wherein the tungsten gas flow reacts with the silicon gas flow to form an additional layer of tungsten silicide; and
(e) sequentially repeating the steps of shutting off and reintroducing the tungsten gas flow n times, where n is an integer of 0 or greater.

In another aspect of the present invention, an electrically conductive runner or wiring in a semiconductor device is provided. This runner or wiring comprises alternating layers of metal silicide and silicon.

In another aspect of the present invention, a method of forming an electrically conductive runner or wiring in a semiconductor device is provided. This method comprises maintaining a silicon gas flow into a CVD chamber, and intermittently pulsing on and off a metal gas flow into the chamber to form a plurality of distinct metal silicide layers.

In another aspect of the present invention, a method of forming an electrically conductive film is provided. This method comprises depositing a plurality of layers of metal silicide, and depositing an interrupting layer between each layer of metal silicide.

In another aspect of the present invention, an electrically conductive film of total thickness t is provided. The film comprises a plurality of metal silicide layers and a plurality of interrupting layers, each interrupting layer being formed between layers of metal silicide. The average grain size in the metal silicide layers is less than about the total thickness t of the film divided by the number of metal silicide layers.

In another aspect of the present invention, a method of forming an electrically conductive film is provided. The method comprises forming a first silicide layer of a first thickness on a substrate so that the maximum vertical grain size is limited to the first thickness. The vertical grain growth of the first silicide layer is interrupted by forming an interrupting layer on an exposed surface of the first silicide layer. A second silicide layer is formed on an exposed surface of the interrupting layer. The step of interrupting the vertical grain growth in the first layer results in the electrically conductive film having reduced residual stress.

DETAILED DESCRIPTION OF THE PREFERRED EMBODIMENT

The preferred embodiment illustrated hereinbelow describes the formation of tungsten silicide by CVD processing. However, it should be appreciated that the method described herein also applies to the formation of other metal suicides, including, but not limited to silicides of Co, Hf, Mo, Nb, Ni, Pd, Pt, Ta, Ti, V and Zr. Furthermore, although the preferred embodiment describes a CVD process, it should be appreciated that other methods used for forming metal suicides, such as sputtering or evaporation, may be used without departing from the scope of the invention.

General Illustration of the Preferred Method and Film

FIGS. 1A–1D and 2 generally illustrate a method for forming a metal silicide film 10 of desired thickness t. First, as described in FIG. 1A and shown in FIG. 2, a layer of metal silicide 14 is deposited over a substrate assembly 12. As used herein, the substrate assembly refers to any of a number of materials, layers or combinations thereof over which the metal silicide layer may be deposited. This may include glasses, plastics, metals, semiconductor wafers and intermediate layers. The layer 14 formed over substrate assembly 12 preferably has a thickness of about 50 to 500 Å, more preferably about 150 Å.

Figure 1:
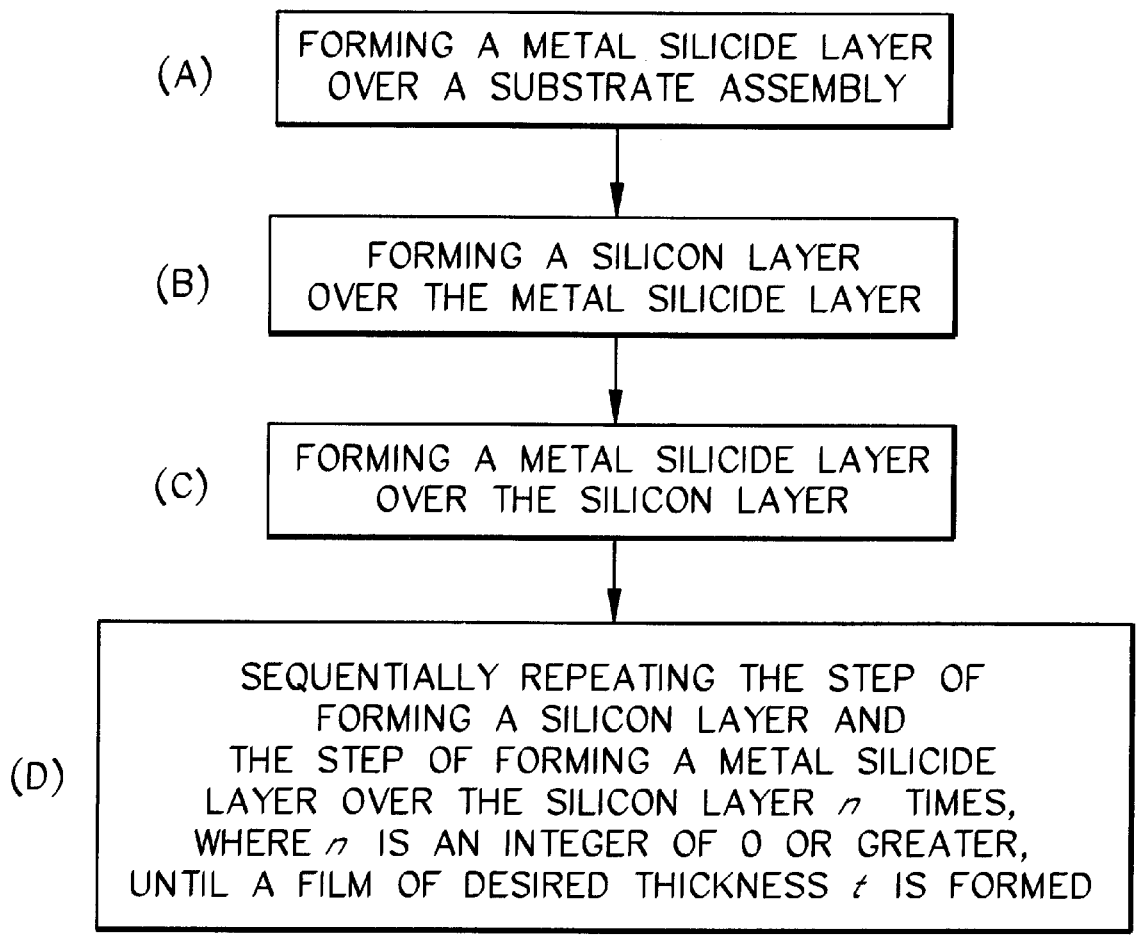
FIGS. 1A–1D depict a flow diagram illustrating generally the method for forming a metal silicide film.

Second, as described in FIG. 1B, an interrupting layer, preferably a silicon layer 16 is formed over the metal silicide layer 14. This layer, as illustrated in FIG. 2, preferably has a thickness of less than about 10 Å, and more preferably comprises only a single layer or two of silicon atoms (i.e., about one or two monolayers).

Third, as described in FIG. 1C, an additional layer of metal silicide 18 is formed over the silicon layer 16. Like layer 14, layer 18 also has a thickness preferably of about 50 to 500 Å. More preferably, layer 18 has the same thickness as layer 14, which, as illustrated in FIG. 2, is about 150 Å.

Fourth, as described in FIG. 1D, the steps described in FIGS. 1B and 1C are sequentially repeated n times, where n is an integer of 0 or greater, until the desired thickness t of the overall film is reached. Specifically, the step of forming a silicon layer and the step of forming a metal silicide layer over the silicon layer are sequentially repeated n times. Thus, where n=0, the processing of film 10 ends after two layers of metal silicide 14 and 18 are formed, separated by a layer of silicon 16. The step described in FIG. 1D is preferably repeated between 0 and 4 times, and as illustrated in FIG. 2, n more preferably has a value of 2 to create a film 10 having four alternating layers of metal silicide.

Figure 2:
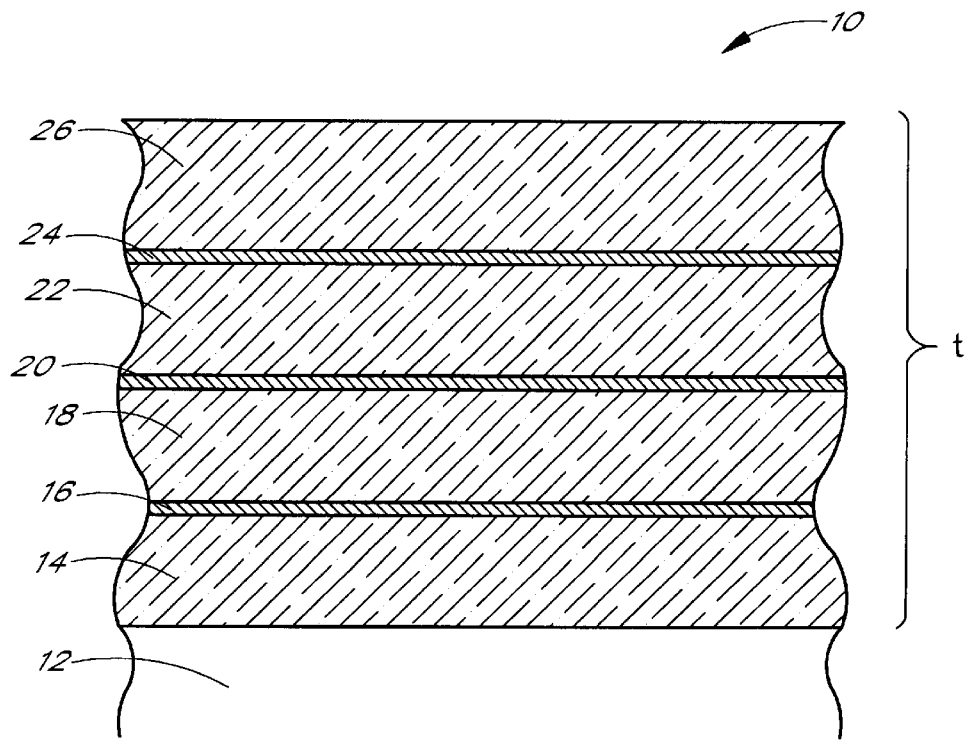
FIG. 2 is a schematic view of a metal silicide film formed by the method described by FIGS. 1A–1D.

The film 10 illustrated in FIG. 2 preferably has a thickness t of between about 100 and 2000 Å. Each layer of metal silicide (14, 18, 22 and 26) has a thickness preferably of about 50 to 500 Å. More preferably, each layer has substantially the same thickness, which, as illustrated, is about 150 Å. Silicon layers 16, 20 and 24 are formed in between the respective metal silicide layers, each preferably having a thickness of less than about 10 Å, and more preferably about one or two monolayers. Thus, when n=2 and each metal silicide layer has a thickness of about 150 Å, the total thickness t of the film 10 is about 600 Å.

The Preferred Method and Film

Figure 3:
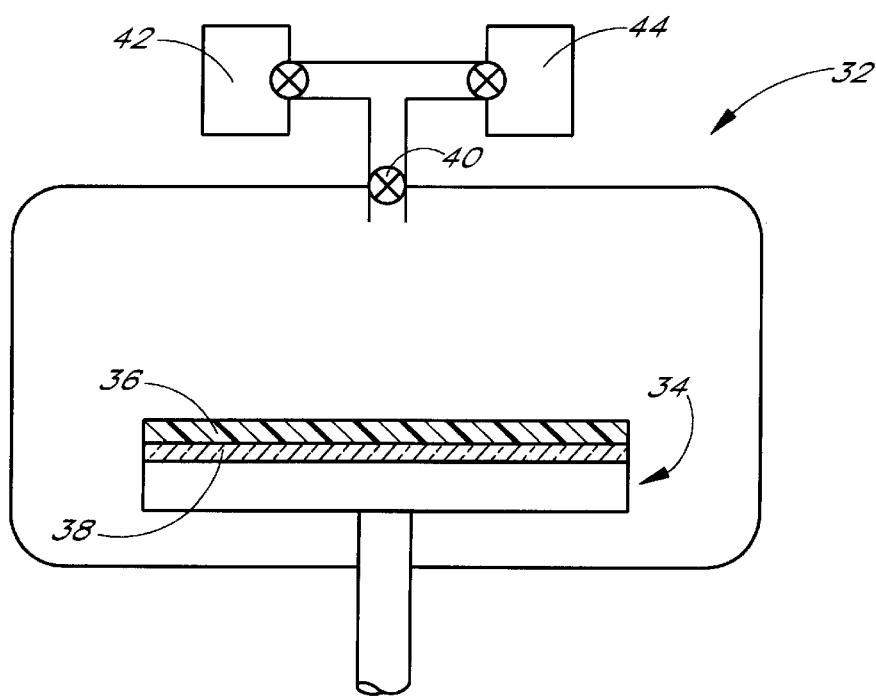
FIG. 3 is a schematic view of a CVD chamber used to form tungsten silicide in accordance with a preferred embodiment of the present invention.

FIG. 3 illustrates more particularly the preferred method of forming a tungsten silicide film 30 by a CVD process. A schematic CVD reaction chamber 32 is provided containing a substrate assembly 34. Preferably, the substrate assembly 34 comprises a layer 36 of TiN deposited on the (100) plane of silicon wafer 38. The layer 36 is used as an etch stop to protect the substrate assembly 34 during subsequent etching, and also as a diffusion barrier to protect the silicon wafer 38. The substrate assembly may also comprise other materials and layers such as glass or polysilicon. The CVD reaction chamber 32 preferably operates at a pressure of about 2 to 500 torr, more preferably about 4.5 torr. The processing temperature is preferably about 350–550° C., and more preferably about 400° C.

The chamber 32 contains one or more gas inlets 40 to allow reaction gases to pass into the chamber 32. As illustrated in FIG. 3, tungsten gas source 42 and silicon gas source 44 are connected to the gas inlet 40. The tungsten and silicon gases are preferably premixed before their introduction into the chamber 32. Preferably, the tungsten gas source is tungsten hexafluoride ($WF_6$), and the silicon gas source is silane ($SiH_4$). However, other gas sources to provide tungsten and silicon into the chamber may also be used. For example, the silicon gas source may also comprise $Si_2H_6$, dichlorosilane or trichlorosilane. In addition, carrier gases such as Ar or He may be provided into chamber 32 to improve gas flow, as would be known to one skilled in the art.

Gas flow rates into the chamber will depend, among other factors, on the desired thickness of the final film and the desired Si:W ratio. Preferably, the silane flow is about 200 to 1000 sccm, and more preferably, about 450 sccm. The $WF_6$ flow rate is preferably about 1 to 10 sccm, and more preferably, about 5 sccm. It should be appreciated that these flow rates may be varied during processing, depending on the desired final product, or may remain substantially the same throughout processing.

Figure 4:
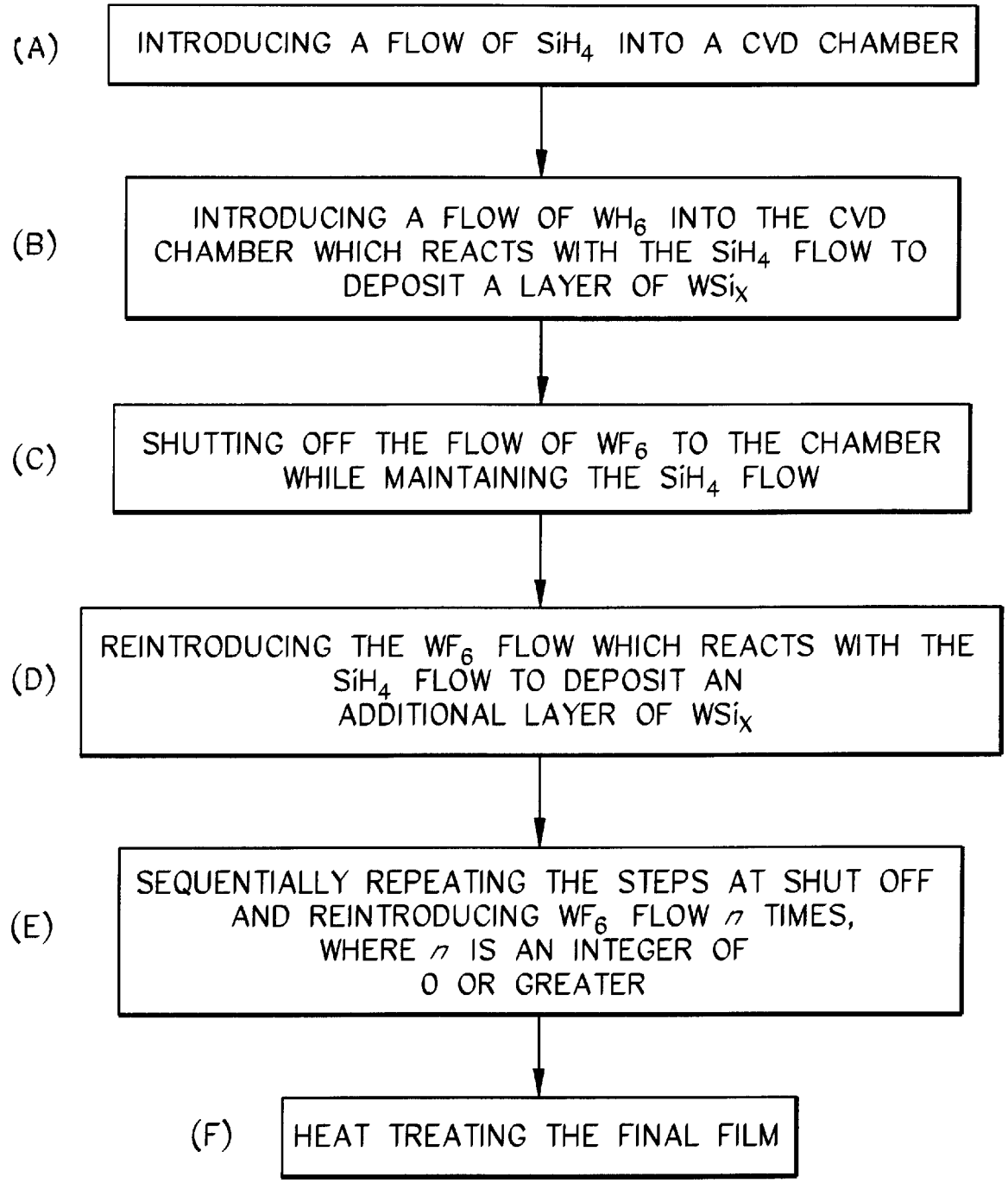
FIGS. 4A–4F depict a flow diagram illustrating the preferred method for forming a tungsten silicide film in accordance with the present invention.
Figure 5:
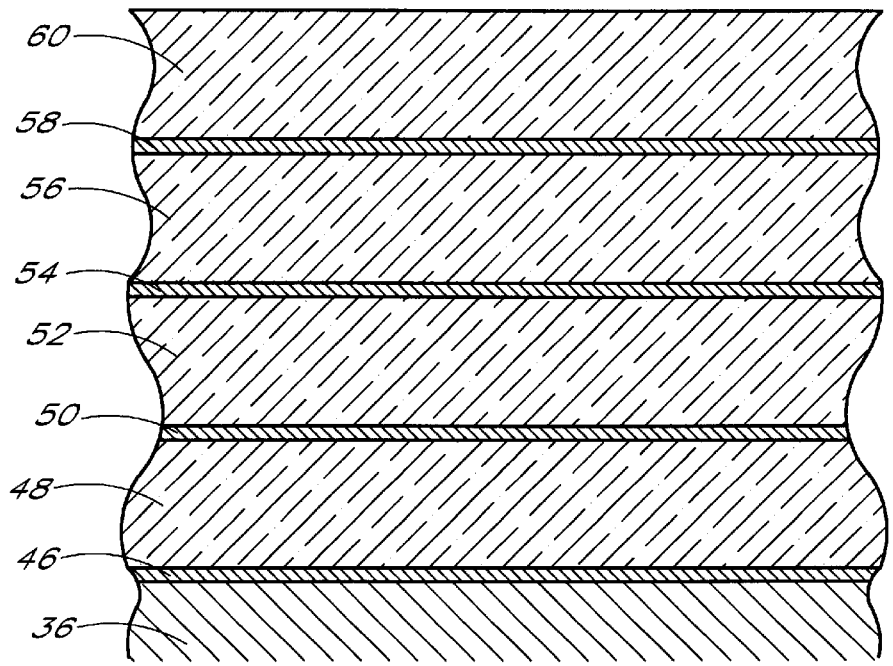
FIG. 5 is a schematic view of a tungsten silicide film formed by the preferred method described by FIGS. 4A–4F.

As described in FIG. 4A, the deposition process begins by introducing silane gas into the chamber 32. This step is known as the "silane soak," where the silane flows preferably for about 1 to 60 seconds before the introduction of tungsten gas into the chamber. More preferably, a silane soak for about 20 seconds creates a thin layer of amorphous silicon 46 on the TiN substrate, preferably having a thickness of less than about 10 Å, more preferably about one or two monolayers, as illustrated in FIG. 5.

Following the silane soak, the tungsten gas flow begins, as described in FIG. 4B. In the preferred embodiment, $WF_6$ flows into the chamber 32 for about 1 to 20 seconds, more preferably about 5 seconds, while the silane continues to flow. The reaction of $SiH_4$ and $WF_6$ creates a tungsten silicide layer 48 preferably having a thickness of 50 to 500 Å. As illustrated in FIG. 5, the tungsten silicide layer 48 is about 150 Å thick.

As described in FIG. 4C, after forming the layer 48 of tungsten silicide, the $WF_6$ flow is shut off from the chamber, leaving only the silane gas flow. This shut off period lasts for at least about 1 second, more preferably 1 to 20 seconds, and optimally about 5 seconds. This causes the creation of a thin layer of silicon 50 over the tungsten silicide layer 48. The layer 50 preferably has a thickness of less than about 10 Å, more preferably about one or two monolayers.

As described in FIG. 4D, after forming the silicon layer 50, the $WF_6$ flow is reintroduced into the chamber to react with the silane flow to form another layer of tungsten silicide 52. Like the layer 48 deposited as described in FIG. 4B, the $WF_6$ flows preferably for about 1 to 20 seconds, more preferably for about 5 seconds, to form a layer 52 having a thickness of about 50 to 500 Å, more preferably of about 150 Å.

As described in FIG. 4E, the steps of shutting off and reintroducing $WF_6$ into the chamber are sequentially repeated n times, where n is an integer of 0 or greater. Thus, the $WF_6$ is intermittently shut off and on to produce alternating layers of $WSi_x$ and Si. As shown in FIG. 5, the preferred embodiment repeats the process two additional times (n=2) to produce four alternating layers of Si and $WSi_x$, with each layer of $WSi_x$ preferably having a thickness of about 150 Å. Thus, the illustrated film 30 of the preferred embodiment has a total thickness of about 600 Å.

By depositing discrete layers of tungsten silicide, as shown in FIG. 5, the resulting film 30 has a disrupted grain structure. The grain size of the tungsten silicide in the vertical direction (i.e., in the direction transverse to the plane of each layer) is limited by the boundaries of each layer, and therefore, cannot be larger than the thickness of each layer. Thus, where the layers of $WSi_x$ each has a thickness of about 150 Å, the vertical diameter of the $WSi_x$ grains can be no larger than about 150 Å.

FIG. 4F describes an additional step in the formation of the tungsten silicide film, where the film 30 is heat treated to increase the conductivity of the film. Preferably, heat treating occurs at a temperature between about 500° C. and 900° C., more preferably above about 700° C., and for the example described herein, about 710° C. for about 20 seconds. The high temperature causes some diffusion of the silicon into the alternating layers of tungsten silicide, as well as some diffusion of the tungsten silicide into the silicon layers. In the final structure, illustrated in FIG. 6, the alternating layers of tungsten silicide and silicon are less distinct because of diffusion between the layers.

Figure 6:
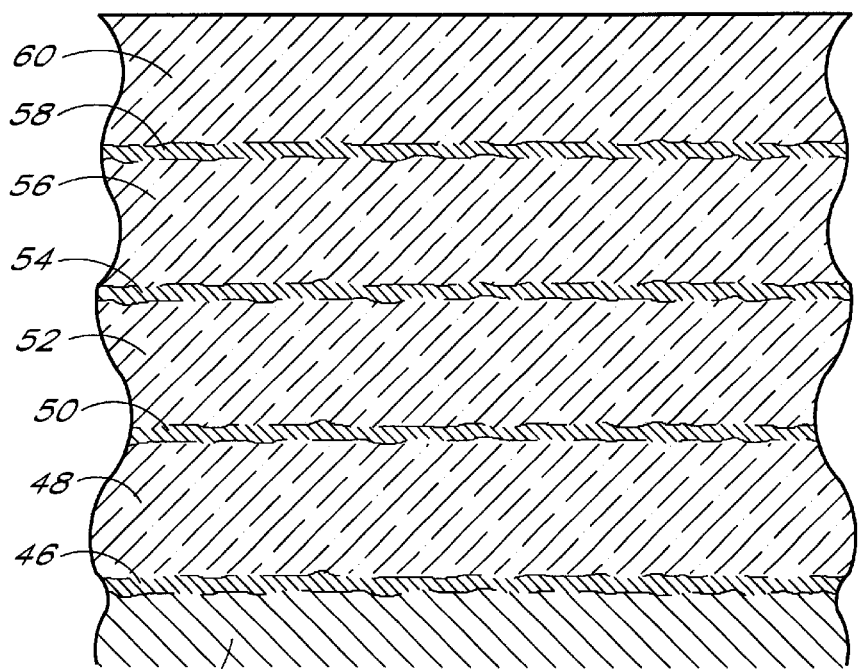
FIG. 6 is a schematic view of the tungsten suicide film of FIG. 5 after heat treating.

The resulting $WSi_x$ film 30 shown in FIG. 6 has an x-factor of about 2 to 3, and more preferably, about 2.1 to 2.6. Furthermore, because the film 30 is formed by depositing a plurality of distinct layers of $WSi_x$, the film 30 has a disrupted grain structure, and therefore, smaller grains than a $WSi_x$ film of the same thickness but deposited continuously. While the heat treatment step may cause grain growth of the $WSi_x$ grains, the size of these grains in the vertical direction remains substantially limited by the thickness of each alternating $WSi_x$ layer.

It will be appreciated that the parameters used in the formation of metal silicide films may vary depending on the desired application and the materials and processes used. Thus, the gas flow rates, the thicknesses of the deposited layers and the heat treating temperature may vary depending on the desired film.

Stress Measurements

The $WSi_x$ film 30 shown in FIG. 6 has improved resistance to stress cracks than a single layer $WSi_x$ film of substantially the same thickness. A comparison was conducted between a single layer $WSi_x$ film and a multiple layer $WSi_x$ film formed according to the preferred embodiment described above. Both samples were tested for resistivity, stress as deposited, and stress as annealed in an $N_2$ environment at 710° C. for 20 seconds. Stress measurements were made using a Fab 4 ADE system to measure stress in the samples by bowing. The results of the comparison are shown in Table 1 below.

TABLE 1

Comparison Between Single Layer and Multiple Layer Tungsten Silicide

|  | Single Layer | Multiple Layer |
| --- | --- | --- |
| Sheet Resistivity | 161.7 Ω/square | 186.6 Ω/square |
| Stress (as deposited) (Gdyne/cm²) | 9.30 | 8.4 |
| Stress (after annealing) (Gdyne/cm²) | 11.10 | 9.76 |

The stress measurements in Table 1 show a significantly lower stress for the multiple layer $WSi_x$ than for the single layer $WSi_x$. Comparing the as-deposited samples, the multiple layer film shows a stress reduction of about 10.7% compared to the single layer film. This result improves for the heat treated samples, where the stress reduction is about 13.7% for the multiple layer film as compared to the single layer film. Normalizing this value for the thickness of the films using the sheet resistivities of the samples, the stress reduction in the heat treated multiple layer film is about 11.9% as compared to the single layer film.

It is believed that the improvement in stress for the multiple layer film compared to the prior art film results from the disrupted grain sizes of the multiple layer film. In particular, by depositing tungsten silicide in intermittent layers, the size of the tungsten silicide grains is naturally limited by the size of each layer. In the example given above, a single layer of tungsten silicide having a total thickness of about 600 Å has a maximum possible vertical grain size of about 600 Å. By comparison, the exemplary multiple layer film having a 600 Å thickness produced by depositing four intermittent layers of tungsten silicide, each separated by thin silicon layers, can have a maximum vertical grain size of only about 150 Å. Because grain growth is generally associated with an overall decrease in volume and a corresponding increase in tensile stress, disrupting the grain structure as described herein reduces grain growth and the associated volume decrease. This in turn decreases the tensile stress of the final film.

Another possible mechanism for the reduction in stress is the extra silicon component in the formed film. The extra silicon causes the thermal expansion coefficient of the film to more closely resemble that of the substrate, thereby reducing stresses in the film due to temperature effects.

It will be appreciated that certain variations in the embodiments described above may suggest themselves to those skilled in the art. The foregoing detailed description is to be clearly understood as being given only by way of illustration. Accordingly, the scope of the invention is intended to be defined by the claims that follow.

What is claimed is:

1. A method of forming an electrically conductive film, comprising:

forming a metal silicide layer over a substrate assembly;

forming a silicon layer having a thickness of less than about 10 Å over the metal silicide layer;

forming a metal silicide layer over the silicon layer; and sequentially repeating the step of forming a silicon layer having a thickness of less than about 10 Å and the step of forming a metal silicide layer over the silicon layer n times, where n is an integer of 0 or greater, until a film of desired thickness t is formed.

2. The method of claim 1, wherein n is an integer of between 0 and 4.

3. The method of claim 1, wherein n=2.

4. The method of claim 1, wherein the desired thickness t of the film is about 100 to 2000 Å.

5. The method of claim 1, wherein each metal silicide layer has a thickness of between about 50 and 500 Å.

6. The method of claim 1, further comprising forming a silicon layer between the substrate assembly and the first metal silicide layer formed over the substrate assembly.

7. The method of claim 1, wherein each metal silicide layer is formed by reacting a silicon gas with a metal gas in a chemical vapor deposition (CVD) chamber.

8. The method of claim 7, wherein each silicon layer is formed by decomposition of the silicon gas.

9. The method of claim 7, wherein the metal gas is intermittently pulsed off and on into the chamber.

10. The method of claim 7, wherein the silicon gas is selected from the group consisting of silane, $Si_2H_6$, dichlorosilane and trichlorosilane.

11. The method of claim 7, wherein the metal gas is selected from the group consisting of Co, Hf, Mo, Nb, Ni, Pd, Pt, Ta, Ti, V, W and Zr gases.

12. The method of claim 1, further comprising heat treating the conductive film.

13. The method of claim 12, wherein heat treating occurs at a temperature between about 500° C. and 900° C.

14. A method of forming a tungsten silicide film by chemical vapor deposition (CVD), comprising:
   introducing a silicon gas flow into a CVD chamber;
   introducing a tungsten gas flow into the chamber which reacts with the silicon gas flow to form a layer of tungsten silicide;
   shutting off the tungsten gas flow from the chamber while maintaining the silicon gas flow into the chamber to form a silicon layer having a thickness less than about 10 Å;
   reintroducing the tungsten gas flow into the chamber after the step of shutting off, wherein the tungsten gas flow reacts with the silicon gas flow to form an additional layer of tungsten silicide; and
   sequentially repeating the steps of shutting off and reintroducing the tungsten gas flow n times, where n is an integer of 0 or greater.

15. The method of claim 14, wherein the silicon gas flow comprises silane ($SiH_4$).

16. The method of claim 15, wherein the silane gas flow rate is about 200 to 1000 sccm.

17. The method of claim 16, wherein the tungsten gas flow comprises tungsten hexafluoride ($WF_6$).

18. The method of claim 17, wherein the tungsten hexafluoride gas flow rate is about 1 to 10 sccm.

19. The method of claim 14, wherein the step of introducing a silicon gas flow precedes the step of introducing tungsten gas flow by about 20 seconds.

20. The method of claim 14, wherein the step of introducing a tungsten gas flow into the chamber lasts for about 1 to 20 seconds.

21. The method of claim 14, wherein the step of shutting off the tungsten gas flow lasts for about 1 to 20 seconds.

22. The method of claim 14, wherein the step of reintroducing tungsten gas flow into the chamber lasts for about 1 to 20 seconds.

23. The method of claim 14, where $n \geq 2$.

24. The method of claim 14, further comprising heat treating the tungsten silicide film at a temperature of between about 500° C. and 900° C.

25. A method of forming an electrically conductive runner or wiring in a semiconductor device, comprising:
   maintaining a silicon gas flow into a CVD chamber; and
   intermittently pulsing on and off a metal gas flow into the chamber to form a plurality of distinct metal silicide layers, said plurality of distinct metal silicide layers together forming a single electrically conductive film.

26. The method of claim 25, wherein the metal gas flow is pulsed on for about 1 to 20 seconds.

27. The method of claim 25, wherein the metal gas flow is pulsed off for about 1 to 20 seconds.

28. A method of forming an electrically conductive film, comprising:
   forming a plurality of layers of metal silicide over a substrate assembly;
   forming an interrupting layer between each layer of metal silicide; and
   at least partially diffusing at least one layer of metal silicide and the interrupting layer into each other to form a single electrically conductive film.

29. The method of claim 28, wherein the interrupting layers are layers of silicon.

30. The method of claim 28, wherein each interrupting layer is less than about 10 Å thick.

31. The method of claim 28, wherein each layer of metal silicide is about 50 to 500 Å thick.

32. A method of forming a single electrically conductive film, comprising:
   forming a first silicide layer of a first thickness on a substrate so that the maximum vertical grain size is limited to the first thickness;
   interrupting the vertical grain growth of the first silicide layer by forming an interrupting layer on an exposed surface of the first silicide layer; and
   forming a second silicide layer on an exposed surface of the interrupting layer, wherein the step of interrupting the vertical grain growth in the first layer results in the electrically conductive film having reduced residual stress, wherein at least the first and second metal silicide layer together with the interrupting layer form a single electrically conductive film.

33. The method of claim 32, further comprising forming additional interrupting layers and additional silicide layers, each additional interrupting layer being formed over an exposed surface of a previously formed silicide layer, and each additional silicide layer being formed on an exposed surface of a previously formed interrupting layer.

34. The method of claim 32, wherein the interrupting layer comprises silicon.

35. The method of claim 32, wherein the first silicide layer has a first thickness of about 50 to 500 Å.

36. The method of claim 32, wherein forming the interrupting layer comprises depositing a layer having a thickness of less than about 10 Å.

37. A method of forming a metal silicide film, comprising:
   forming a plurality of metal silicide layers;
   forming at least one layer of silicon alternating between the plurality of metal silicide layers, each layer of silicon being no more than about one to two monolayers thick; and
   at least partially diffusing the layers of metal silicide and silicon into each other to form a single electrically conductive film.

38. The method of claim 37, wherein each layer of metal silicide has a thickness of about 50 to 500 Å.

39. The method of claim 37, wherein the total thickness of the electrically conductive metal silicide film is about 200 to 2000 Å.

40. The method of claim 37, wherein the metal silicide is tungsten silicide.

41. The method of claim 37, wherein the metal silicide is an electrically conductive runner or wiring in a semiconductor device.

42. A method of forming an electrically conductive film of total thickness t, comprising:

forming a plurality of metal silicide sub-layers one over another and separated by no more than about 10 Å, each of the sub-layers including a plurality of grains, the grain structure of each layer being disrupted from the grain structure of an adjacent layer;

wherein the average vertical grain size in each of the metal silicide sub-layers is less than about the total thickness t of the film divided by the number of metal silicide sub-layers, and the plurality of metal silicide sub-layers together form a single electrically conductive film.

43. The method of claim 42, wherein each sub-layer of metal silicide has a thickness of about 50 to 500 Å.

44. The method of claim 42, wherein the grain structure of each layer is disrupted by the formation of silicon layers between the metal silicide sub-layers.

45. The method of claim 42, wherein the metal silicide is tungsten silicide.

46. The method of claim 42, wherein t is about 200 to 2000 Å.

47. The method of claim 42, including forming at least four metal silicide sub-layers.

48. A method of forming metal silicide film, comprising:

forming a plurality of metal silicide layers, wherein the growth of each of said layers is interrupted so as to disrupt the grain structure of each of the layers between layers such that when the metal silicide film has a total thickness t, the average grain size in each of the metal silicide layers is less than t divided by the total number of metal silicide layers;

wherein the plurality of metal silicide layers together form a single electrically conductive film.

49. The method of claim 48, wherein each layer of metal silicide has a thickness of about 50 to 500 Å.

50. The method of claim 48, wherein the growth of each of said layers is interrupted by the forming silicon layers between the metal silicide layers.

51. The method of claim 48, wherein the metal silicide is tungsten silicide.

52. The method of claim 48, wherein t is about 200 to 2000 Å.

53. The method of claim 48, including forming at least four metal silicide layers.

* * * * *

UNITED STATES PATENT AND TRADEMARK OFFICE
CERTIFICATE OF CORRECTION

PATENT NO. : 6,537,910 B1
DATED : March 25, 2003
INVENTOR(S) : Burke et al.

It is certified that error appears in the above-identified patent and that said Letters Patent is hereby corrected as shown below:

Column 1,
Lines 21 and 24, please delete "suicides" and insert -- silicides --.

Column 3,
Lines 12, 21 and 25, please delete "suicide" and insert -- silicides --.

Signed and Sealed this

Ninth Day of November, 2004

JON W. DUDAS
*Director of the United States Patent and Trademark Office*